United States Patent
Ramaswamy

(10) Patent No.: US 8,846,516 B2
(45) Date of Patent: Sep. 30, 2014

(54) DIELECTRIC CHARGE-TRAPPING MATERIALS HAVING DOPED METAL SITES

(75) Inventor: Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1283 days.

(21) Appl. No.: 11/774,298

(22) Filed: Jul. 6, 2007

(65) Prior Publication Data
US 2009/0008702 A1 Jan. 8, 2009

(51) Int. Cl.
*H01L 21/4763* (2006.01)
*H01L 29/423* (2006.01)
*B82Y 10/00* (2011.01)
*H01L 21/28* (2006.01)

(52) U.S. Cl.
CPC .......... *H01L 29/42332* (2013.01); *B82Y 10/00* (2013.01); *H01L 21/28273* (2013.01)
USPC ................ 438/591; 257/324; 257/E29.309; 257/E21.294; 438/686; 438/687

(58) Field of Classification Search
USPC .......... 257/645, 651, 324, E29.309, E21.294; 438/288, 591, 686, 687, 685, 653
See application file for complete search history.

(56) References Cited

U.S. PATENT DOCUMENTS

| | | | |
|---|---|---|---|
| 5,374,456 A * | 12/1994 | Matossian et al. | 427/570 |
| 5,740,104 A | 4/1998 | Forbes | |
| 6,074,488 A * | 6/2000 | Roderick et al. | 118/728 |
| 6,140,181 A | 10/2000 | Forbes et al. | |
| 6,150,257 A | 11/2000 | Yin et al. | |
| 6,774,022 B2 | 8/2004 | Wang et al. | |
| 6,818,909 B2 * | 11/2004 | Murrell et al. | 250/492.2 |
| 6,878,602 B2 | 4/2005 | Basceri et al. | |
| 6,980,467 B2 | 12/2005 | King | |
| 7,067,442 B1 | 6/2006 | Thakur et al. | |
| 7,132,336 B1 * | 11/2006 | Aronowitz et al. | 438/288 |
| 2005/0022839 A1 * | 2/2005 | Savas et al. | 134/1.2 |
| 2005/0026433 A1 | 2/2005 | Li et al. | |
| 2005/0205969 A1 * | 9/2005 | Ono et al. | 257/645 |
| 2005/0211923 A1 * | 9/2005 | Banks | 250/492.21 |
| 2006/0286747 A1 | 12/2006 | Mouli et al. | |

* cited by examiner

*Primary Examiner* — Mark A Laurenzi
(74) *Attorney, Agent, or Firm* — Dicke, Billig & Czaja, PLLC

(57) ABSTRACT

Dielectric materials having implanted metal sites and methods of their fabrication have been described. Such materials are suitable for use as charge-trapping nodes of non-volatile memory cells for memory devices. By incorporating metal sites into dielectric charge-trapping materials using an ammonia plasma and a metal source in contact with the plasma, improved programming and erase voltages may be facilitated.

21 Claims, 4 Drawing Sheets

DIELECTRIC CHARGE-TRAPPING MATERIALS HAVING DOPED METAL SITES

TECHNICAL FIELD

The present disclosure relates generally to memory devices, and in a particular embodiment, the present disclosure relates to methods for treating dielectric charge-trapping materials to generate a gradient of metal sites within the treated materials, and memory apparatus making use of such treated charge-trapping materials as charge-trapping nodes.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Non-volatile memory is memory that can retain its data values for some extended period without the application of power. Flash memory devices typically use a one-transistor memory cell that allows for high memory densities, high reliability, and low power consumption. Changes in threshold voltage of the cells, through programming of charge storage or trapping layers or other physical phenomena, determine the data value of each cell. By defining two or more ranges of threshold voltages to correspond to individual data values, one or more bits of information may be stored on each cell. Common uses for flash memory and other non-volatile memory include personal computers, personal digital assistants (PDAs), digital cameras, digital media players, digital recorders, games, appliances, vehicles, wireless devices, mobile telephones and removable memory modules, and the uses for non-volatile memory continue to expand.

Flash memory typically utilizes one of two basic architectures known as NOR flash and NAND flash. The designation is derived from the logic used to read the devices. In NOR flash architecture, a column of memory cells are coupled in parallel with each memory cell coupled to a bit line. In NAND flash architecture, a column of memory cells are coupled in series with only the first memory cell of the column coupled to a bit line.

One common type of flash memory is a nitride read only memory (NROM), sometimes referred to as silicon-oxide-nitride-oxide-silicon (SONOS) memory. Such devices generally include silicon nitride ($Si_3N_4$) as a charge-trapping node, although other dielectric materials may be utilized. By accumulating charge in, or discharging, the charge-trapping node within a memory cell, the threshold voltage of that memory cell may be altered. As memory cells become smaller, it generally becomes more difficult to accumulate sufficient charge to readily distinguish differing data states, and charge retention of the charge-trapping node becomes increasingly critical.

For the reasons stated above, and for other reasons that will become apparent to those skilled in the art upon reading and understanding the present specification, there is a need in the art for alternative charge-trapping materials for use in non-volatile memory devices.

DETAILED DESCRIPTION

In the following detailed description of the present embodiments, reference is made to the accompanying drawings that form a part hereof, and in which is shown by way of illustration specific embodiments in which the disclosure may be practiced. These embodiments are described in sufficient detail to enable those skilled in the art to practice the embodiments of the disclosure, and it is to be understood that other embodiments may be utilized and that process, chemical, electrical or mechanical changes may be made without departing from the present disclosure. The following detailed description is, therefore, not to be taken in a limiting sense.

The various embodiments of the disclosure utilize a plasma treatment of a dielectric charge-trapping material to incorporate metal sites within a portion of the charge-trapping material. These metal sites facilitate increased charge storage and retention. These treated charge-trapping materials may be utilized in the fabrication of integrated circuit memory devices.

Figure 1:
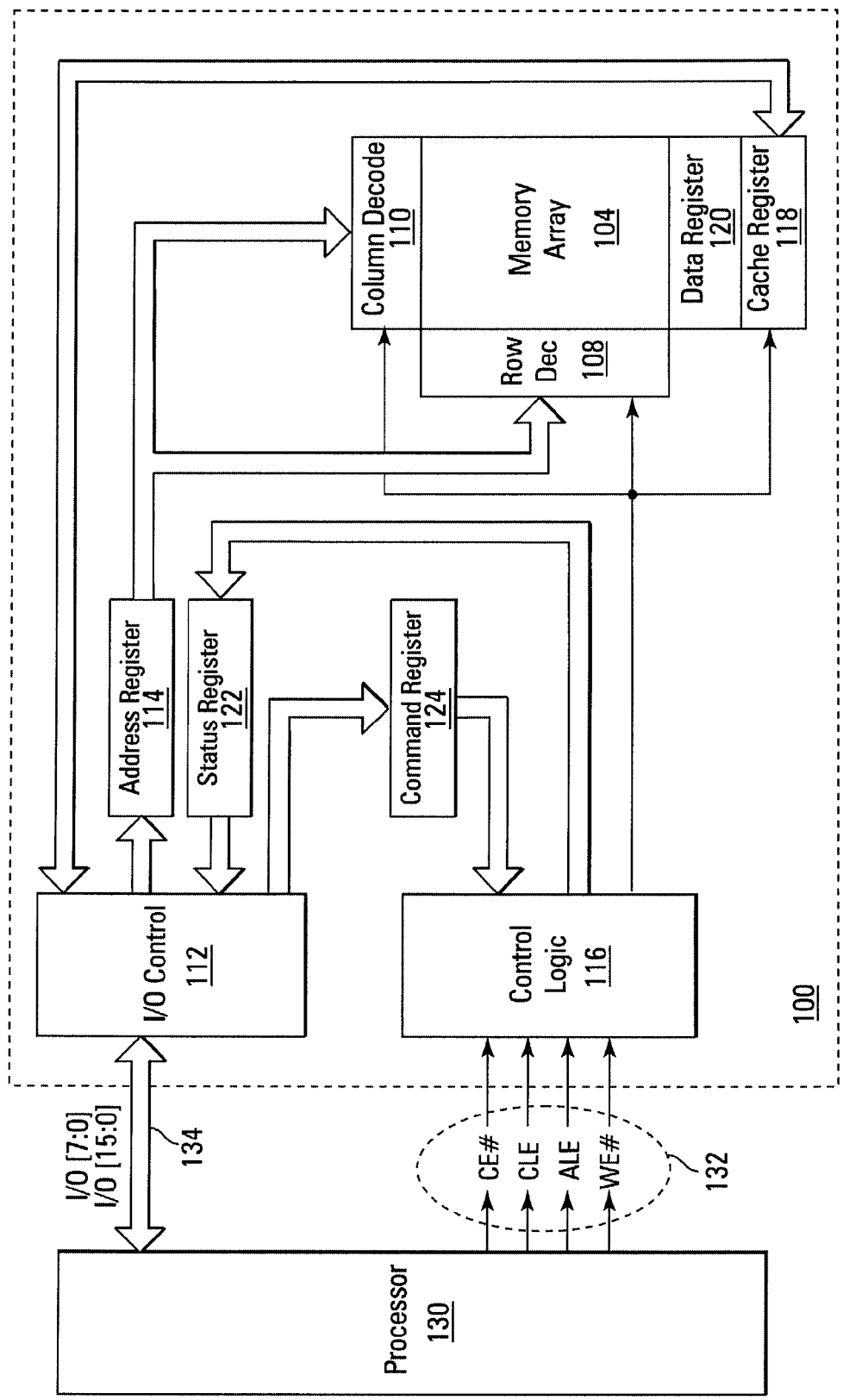
FIG. 1 is a simplified block diagram of a memory device in communication with a processor as part of an electronic system, according to an embodiment of the disclosure.

FIG. 1 is a simplified block diagram of a memory device 100 in communication with (e.g., coupled to) a processor 130 as part of an electronic system, according to an embodiment of the disclosure. Some examples of electronic systems include personal computers, personal digital assistants (PDAs), digital cameras, digital media players, digital recorders, games, appliances, vehicles, wireless devices, mobile telephones, memory modules and the like. The processor 130 may be a memory controller or other external processor.

Memory device 100 includes an array of memory cells 104 arranged in rows and columns. The array of memory cells 104 includes charge-trapping nodes in accordance with one or more of the various embodiments. Although the various embodiments will be described primarily with reference to NAND memory arrays, the various embodiments are not limited to a specific architecture of the memory array 104. Some examples of other array architectures suitable for the present embodiments include NOR arrays, AND arrays, and virtual ground arrays.

A row decode circuitry 108 and a column decode circuitry 110 are provided to decode address signals. Address signals are received and decoded to access memory array 104. Memory device 100 also includes input/output (I/O) control circuitry 112 to manage input of commands, addresses and data to the memory device 100 as well as output of data and status information from the memory device 100. An address register 114 is coupled between I/O control circuitry 112 and row decode circuitry 108 and column decode circuitry 110 to latch the address signals prior to decoding. A command register 124 is coupled between I/O control circuitry 112 and control logic 116 to latch incoming commands. Control logic 116 controls access to the memory array 104 in response to the commands and generates status information for the external processor 130. The control logic 116 is coupled to row decode circuitry 108 and column decode circuitry 110 to control the row decode circuitry 108 and column decode Control logic 116 is also coupled to a cache register 118. Cache register 118 latches data, either incoming or outgoing, as directed by control logic 116 to temporarily store data while the memory array 104 is busy writing or reading, respectively, other data. During a write operation, data is passed from the cache register 118 to data register 120 for transfer to the memory array 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is coupled between I/O control circuitry 112 and control logic 116 to latch the status information for output to the processor 130.

Memory device 100 receives control signals at control logic 116 from processor 130 over a control link 132. The control signals may include a chip enable CE#, a command latch enable CLE, an address latch enable ALE, and a write enable WE#. Memory device 100 receives commands (in the form of command signals), addresses (in the form of address signals), and data (in the form of data signals) from processor 130 over a multiplexed input/output (I/O) bus 134 and outputs data to processor 130 over I/O bus 134.

Specifically, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming memory array 104. For another embodiment, cache register 118 may be omitted, and the data are written directly into data register 120. Data are also output over input/output (I/O) pins [7:0] for an 8-bit device or input/output (I/O) pins [15:0] for a 16-bit device. It will be appreciated by those skilled in the art that additional circuitry and signals can be provided, and that the memory device of FIG. 1 has been simplified to help focus on the present disclosure. Additionally, while the memory device of FIG. 1 has been described in accordance with popular conventions for receipt and output of the various signals, it is noted that the various embodiments are not limited by the specific signals and I/O configurations described unless expressly noted herein.

Figure 2:
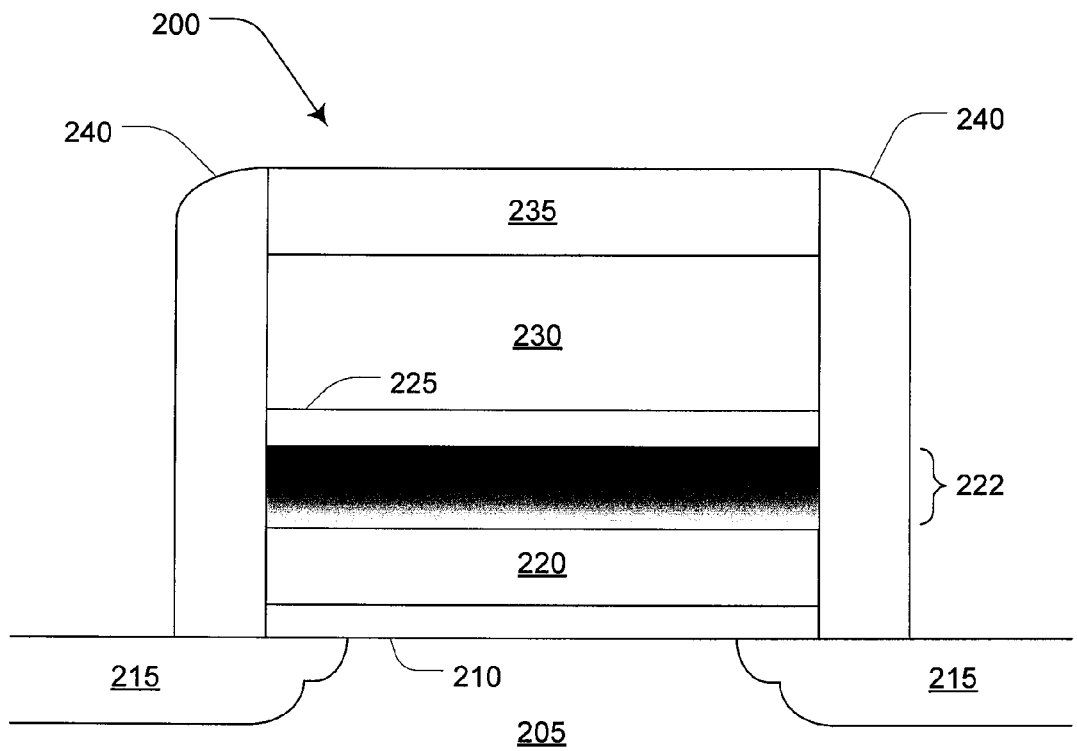
FIG. 2 is a cross-sectional view of a memory cell in accordance with an embodiment of the disclosure.

FIG. 2 is a cross-sectional view of a floating-node transistor or memory cell 200 in accordance with an embodiment of the disclosure. The memory cell 200 is formed on a semiconductor substrate 205. For one embodiment, the substrate 205 is a monocrystalline silicon substrate. For a further embodiment, substrate 205 is a p-type monocrystalline silicon substrate.

The gate dielectric 210 is formed over an active region of the substrate 205, over which memory cells will be formed. The gate dielectric 210 might be formed by thermal oxidation of the silicon substrate 205. Alternatively, the gate dielectric 210 could be formed by a blanket deposition of a dielectric material, such as by chemical vapor deposition (CVD) or physical vapor deposition (PVD). For one embodiment, gate dielectric 210 contains silicon oxide ($SiO_2$), but may alternatively include high-K dielectrics such as $HfO_2$, $ZrO_2$, $Al_2O_3$, HfSiON, $La_2O_3$, $Y_2O_3$, etc.

Source/drain regions 215 are formed in the substrate 205 generally adjacent the gate dielectric 210. A channel region of the memory cell 200 is defined by the area of the substrate 205 between the source/drain regions 215. Source/drain regions 215 will generally have a conductivity type opposite the conductivity type of the substrate 205. For example, for a p-type substrate 205, the source/drain regions 215 might have an n+-type conductivity.

A charge-trapping node 220 is formed over the gate dielectric 210. The charge-trapping node 220 in one embodiment is one or more layers of dielectric material that will store a charge indicative of a programmed state of the memory cell 200. An implanted region 222 of the charge-trapping node 220 has a gradient of metal sites. Formation of the implanted region 222 will be described in more detail with reference to FIG. 4 and occurs prior to formation of the intergate dielectric 225.

For one embodiment, the charge-trapping node 220 contains a silicon nitride. While the silicon nitride may have the stoichiometric formula of $Si_3N_4$, the silicon nitride may further be silicon rich, i.e., of the formula $SiN_x$ where x is less than 4/3, or nitride rich, i.e., of the formula $SiN_x$ where x is greater than 4/3.

The intergate dielectric 225 is formed over the charge-trapping node 220. The intergate dielectric 225 comprises a dielectric material. For one embodiment, intergate dielectric 225 comprises silicon oxide ($SiO_2$), but may alternatively include high-K dielectrics such as hafnium oxide ($HfO_2$), zirconium oxide ($ZrO_2$), aluminum oxide ($Al_2O_3$), aluminum hafnium oxide (AlHfOx), etc. The dielectrics can be single layer or multiple layer dielectrics in various embodiments.

A control-gate 230 is formed over the intergate dielectric 225. The control gate 230 can include one or more layers of conductive material. For one embodiment, the control gate 230 contains a conductively-doped polysilicon. For a further embodiment, the control gate 230 includes a metal-containing layer over a polysilicon layer, e.g., a refractory metal silicide layer formed on a conductively-doped polysilicon layer. The metals of chromium (Cr), cobalt (Co), hafnium (Hf), molybdenum (Mo), niobium (Nb), tantalum (Ta), titanium (Ti), tungsten (W), vanadium (V), zirconium (Zr), and metal nitrides (including for example titanium nitride, tantalum nitride, tantalum carbon nitride, tungsten nitride) for metal gates are generally recognized as refractory metals. For another embodiment, the control gate 230 contains multiple metal-containing layers, e.g., a titanium nitride (TiN) barrier layer over the intergate dielectric 225, a titanium (Ti) adhesion layer over the barrier layer and a tungsten (W) layer over the adhesion layer.

A cap 235 is generally formed over the control-gate 230 to act as an insulator and barrier layer to protect the control-gate 230 during subsequent processing. The cap 235 contains a dielectric material and may include such dielectrics as silicon oxides (SiOx), silicon nitride (SiNx), and silicon oxynitrides (SiOxNy). For one embodiment, the cap 235 is a silicon nitride, formed by such methods as CVD.

The gate stack, i.e., gate dielectric 210, charge-trapping node 220, intergate dielectric 225, control-gate 230 and cap 235, may be patterned to define word lines of a memory device. It is noted that additional layers may form the gate stack, such as barrier layers to inhibit diffusion between opposing layers or adhesion layers to promote adhesion between opposing layers. Sidewall spacers 240 may be formed on the sidewalls of the gate stacks to protect and insulate the sidewalls. Sidewall spacers 240 are typically the same dielectric material as used for the cap 235, but may include other dielectric materials. Formation may include a blanket deposit of a layer of dielectric material on the patterned gate stacks followed by an anisotropic etch to preferentially remove horizontal portions of the layer of dielectric material, leaving vertical portions adjacent the sidewalls of the gate stacks.

Figure 3:
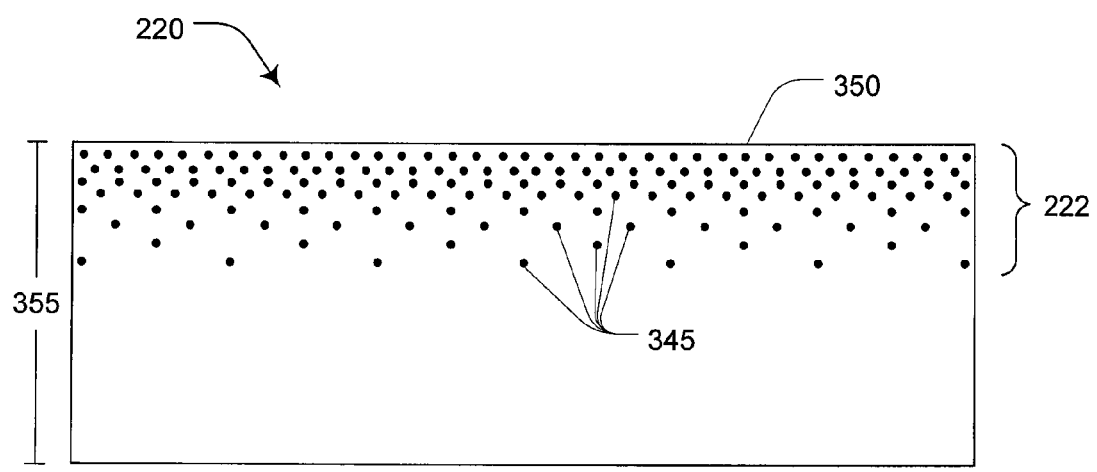
FIG. 3 is a cross-sectional view of a charge-trapping node of the memory cell of FIG. 2.

FIG. 3 is a cross-sectional view of a charge-trapping node 220 showing further detail of the implanted region 222 within charge-trapping material. FIG. 3 shows conceptually the gradient of metal sites 345, having a higher concentration level near a surface 350 of the charge-trapping node 220. The surface 350 is the surface of the charge-trapping node 220 that is exposed to a plasma (such as ammonia plasma, nitrogen plasma, argon plasma, helium plasma, or hydrogen plasma) for metal implantation as described in more detail with reference to FIG. 4. For one embodiment, the metal sites 345 have a concentration near the surface 350 of approximately $10^{16}$-$10^{20}$ particles/cm$^3$. For another embodiment, the metal sites 345 extend to a depth of less than the thickness 355 of the charge-trapping node 220. For a further embodiment, the metal sites 345 extend to a depth of less than approximately one-half the thickness 355 of the charge-trapping node 220. It should be noted that the distribution of metal particles can be uniform or graded as needed, that is the metal particle distribution can be graded as needed or can be uniform.

Figure 4:
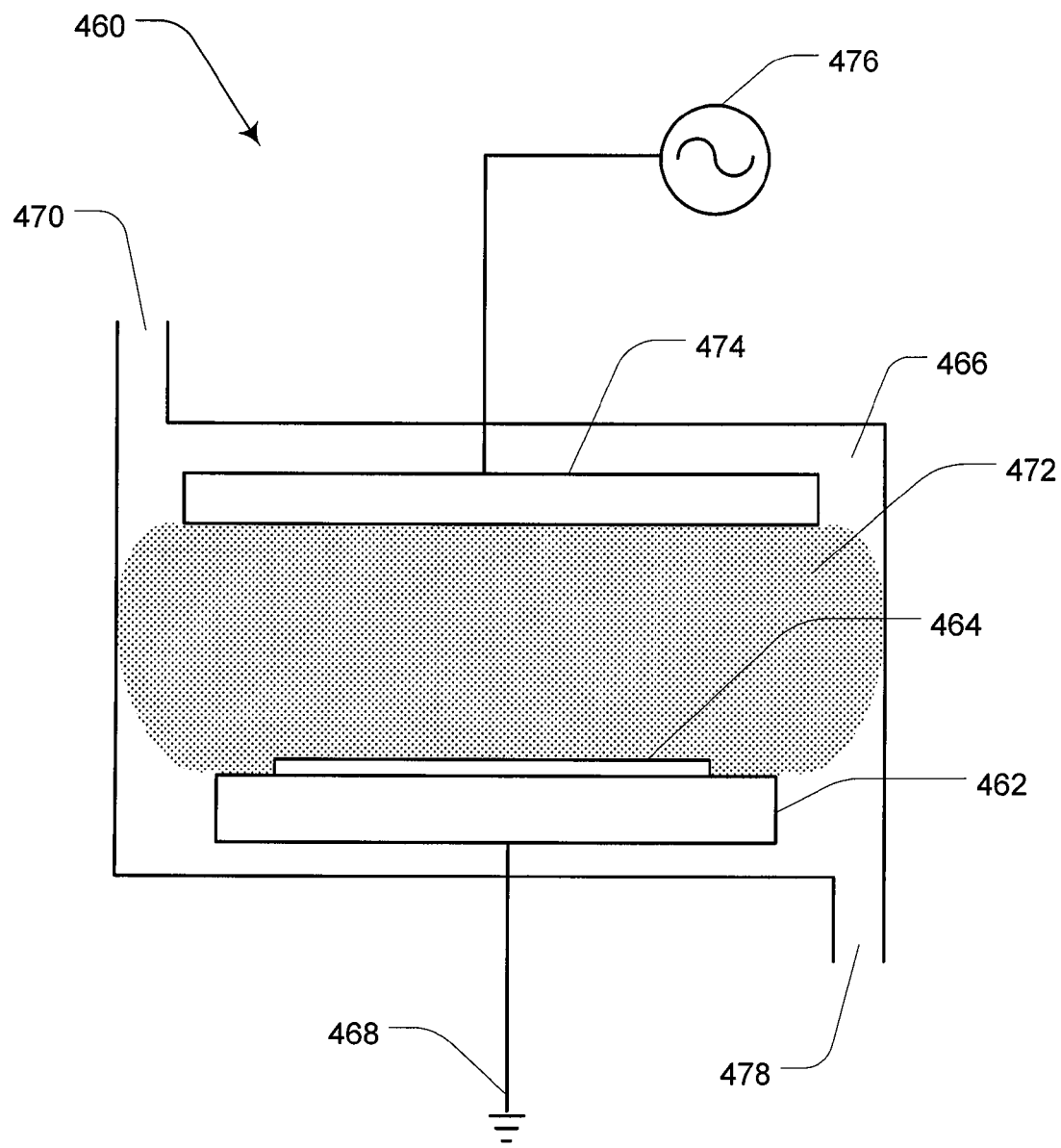
FIG. 4 is a schematic illustration of a reactor system suitable for use with embodiments of the disclosure.

FIG. 4 is a schematic illustration of a plasma reactor system 460, such as a plasma-enhanced chemical vapor deposition (PECVD) reactor system, suitable for use with the embodiments of the disclosure. Those familiar with such apparatus will recognize that FIG. 4 is a simplified schematic and that typical plasma reactor system may contain additional or alternate components. In general, any reactor system 460 capable of generating a plasma as described herein may be used with the various embodiments.

A first electrode 462, such as a conductive pedestal, supporting a substrate 464 is located in a chamber 466. The electrode 462 is typically connected to a ground node 468. A gas inlet 470 is provided for introduction of component gases into the chamber 466. The component gases make up the plasma 472. The component gases are generally fed to the chamber 466 continuously during the operation of the reactor 460. The component gases include at least ammonia (NH$_3$), argon (Ar), hydrogen (H$_2$), helium (He) or nitrogen (N$_2$), or ambient gases within the chamber 466. For one embodiment, the component gases include approximately 2000-4000 sccm of ammonia and approximately 2000 sccm of carrier or ambient gas, or approximately 30-50 volume % ammonia in the component gases.

A second electrode 474 is located in the chamber 466 and is connected to a power source 476. A gas outlet 478 allows excess or spent gases to be removed from the chamber 466, such as by a vacuum pump (not shown). Excitation of the component gases within the chamber, such as through the application of RF (radio frequency) energy across the electrodes 474 and 462, can be used to generate the plasma 472. Although the system 460 is shown to use an alternating current power source for generation of the plasma 472, other sources of plasma are known, such as electron cyclotron resonance (ECR), reflected electron, helicon wave, inductively coupled plasma (ICP) and transformer coupled plasma (TCP).

Regardless of the source of the plasma, the plasma 472 is formed to be in concurrent contact with metal and the surface of substrate 464. The metal will serve as a source for generating the metal sites within a dielectric charge-trapping material, such as in the example depicted in FIG. 3, on a surface of the substrate 464. The metal source may include a component of the system 460, such as an interior wall of the chamber 466 or the electrode 474. Alternatively, the metal source may include a sacrificial coupon (not shown) placed within the chamber 466 for contact with the plasma 472. For one embodiment, the metal source contains a refractory metal. The metals of chromium (Cr), cobalt (Co), hafnium (Hf), molybdenum (Mo), niobium (Nb), tantalum (Ta), titanium (Ti), tungsten (W), vanadium (V), zirconium (Zr), and metal nitrides (including for example titanium nitride, tantalum nitride, tantalum carbon nitride, tungsten nitride) for metal gates are generally recognized as refractory metals. For another embodiment, the metal source contains a noble or near noble metal such as silver (Ag), gold (Au), palladium (Pd), platinum (Pt), rhenium (Rh), iridium (Ir), ruthenium (Ru) and osmium (Os).

During operation, the plasma 472 will contain a variety of energetic components, such as atoms, radicals, ions, electrons and photons. Contact of at least some of the energetic components of the plasma 472 with the metal source can free metal ions from the metal source. These metal ions may then implant into a surface of the substrate 464, such as a dielectric charge-trapping material for a future charge-trapping node. Accumulation of metal ions within the dielectric charge-trapping material will generate the metal sites as their electron states are restored. Many of these metal sites are expected to have a particle size on an atomic scale, such as approximately 3-4 Angstroms.

A depth and concentration of the metal sites within the dielectric charge-trapping material will depend in part on the power applied to generate the plasma, with increasing power resulting in deeper implantations and higher concentrations of the metal sites. For one embodiment, the plasma 472 is generated using a power of approximately 200-1000 W. For a further embodiment, the plasma 472 is generated using a power of approximately 400-800 W. Longer exposures to the plasma will also generally lead to higher concentrations of metal sites and migration deeper into the surface. For one embodiment, exposures times of 80-400 seconds are used. For a further embodiment, a combination of power and exposure time is chosen to generate a concentration of metal sites having a magnitude of approximately $10^{18}$-$10^{20}$ particles/cm$^3$ near a surface of the charge-trapping node. For a still further embodiment, a combination of power and exposure time is chosen to generate a concentration of metal sites having a magnitude of approximately $10^{17}$-$10^{19}$ particles/cm$^3$ approximately 2 nm from the surface of the charge-trapping node. For a still further embodiment, a combination of power and exposure time is chosen to generate a concentration gradient of metal sites falling substantially two orders of magnitude within 4 nm of the surface of the charge-trapping node.

Table 1 lists concentrations of metal sites as determined by Dynamic Secondary Ion Mass Spectrometry (Dynamic SIMS) for a variety of examples at differing power and exposure times using an ammonia plasma, a titanium metal source and a silicon nitride dielectric layer. Dynamic SIMS is a commonly-used technique for depth profiling of materials. The units for concentration in Table 1 are arbitrary, and the data are skewed by the matrix effect inherent in Dynamic SIMS analysis, but the data generally depict the relative concentration levels between the various samples. Thus, the data of Table 1 demonstrate the relationship between power and time and show that similar concentration values can be generated at two different power levels by adjusting the exposure times and vice versa.

TABLE 1

Relative Concentration of Metal Sites at Various Depths Using an Ammonia Plasma, a Titanium Metal Source and a Silicon Nitride Dielectric Layer

| Depth (nm) | 500 W 80 s | 400 W 160 s | 800 W 80 s | 500 W 160 s | 400 W 320 s | 800 W 160 s | 500 W 400 s |
|---|---|---|---|---|---|---|---|
| 2  | 3E18 | 4E18 | 5E18 | 8E18 | 9E18 | 2E19 | 2E19 |
| 5  | 1E18 | 1E18 | 2E18 | 3E18 | 4E18 | 8E18 | 9E18 |
| 10 | 1E17 | 2E17 | 2E17 | 4E17 | 5E17 | 9E17 | 1E18 |
| 15 | 3E16 | 4E16 | 5E16 | 8E16 | 1E17 | 2E17 | 3E17 |
| 20 | 1E16 | 2E16 | 4E16 | 7E16 | 1E17 | 2E17 | 4E17 |

For one embodiment, the metal sites within the charge-trapping material constitute less than about 0.5 atomic % (at %) of the charge-trapping node. For a further embodiment, the metal sites within the charge-trapping material constitute at least approximately 0.0001 at % of the charge-trapping node. For a still further embodiment, the metal sites within the charge-trapping material constitute approximately 0.0001-0.5 at % of the charge-trapping node. The process is amenable to use with multiple plasmas including those described, provided appropriate materials are sputtered within the chamber, i.e., from the side walls.

While actual depths and concentrations of metal sites at any given power/time combination will depend upon the choice of dielectric material and metal source, concentration profiles of a layer of a test material can be readily generated using known analytical techniques. Time of Flight Secondary Ion Mass Spectrometry (ToF-SIMS) is a commonly-used technique to analyze a material surface to obtain elemental and molecular chemical information about that surface. By controlled etching of the test surface to section the sample at various depths, concentration profiles for a material can be generated while avoiding the matrix effect of Dynamic SIMS. Thus, for the chosen dielectric material and metal source, an appropriate plasma power and reaction time can be determined to obtain a desired concentration profile.

While implantation has been discussed as a method of forming the metal sites in the embodiments described herein, it should be understood that other methods of forming a distributed metal dielectric are amenable to use with the various embodiments. For example, a layered structure of a thin layer of metal alternating with a thin layer of metal to form a sequential distributed metal dielectric could be used to form the distributed structure. This is accomplished in one embodiment with an ALD or CVD deposition of a thin metal alternated with ALD growth of a thin dielectric to sequentially form a distributed metal in the dielectric.

Figure 5:
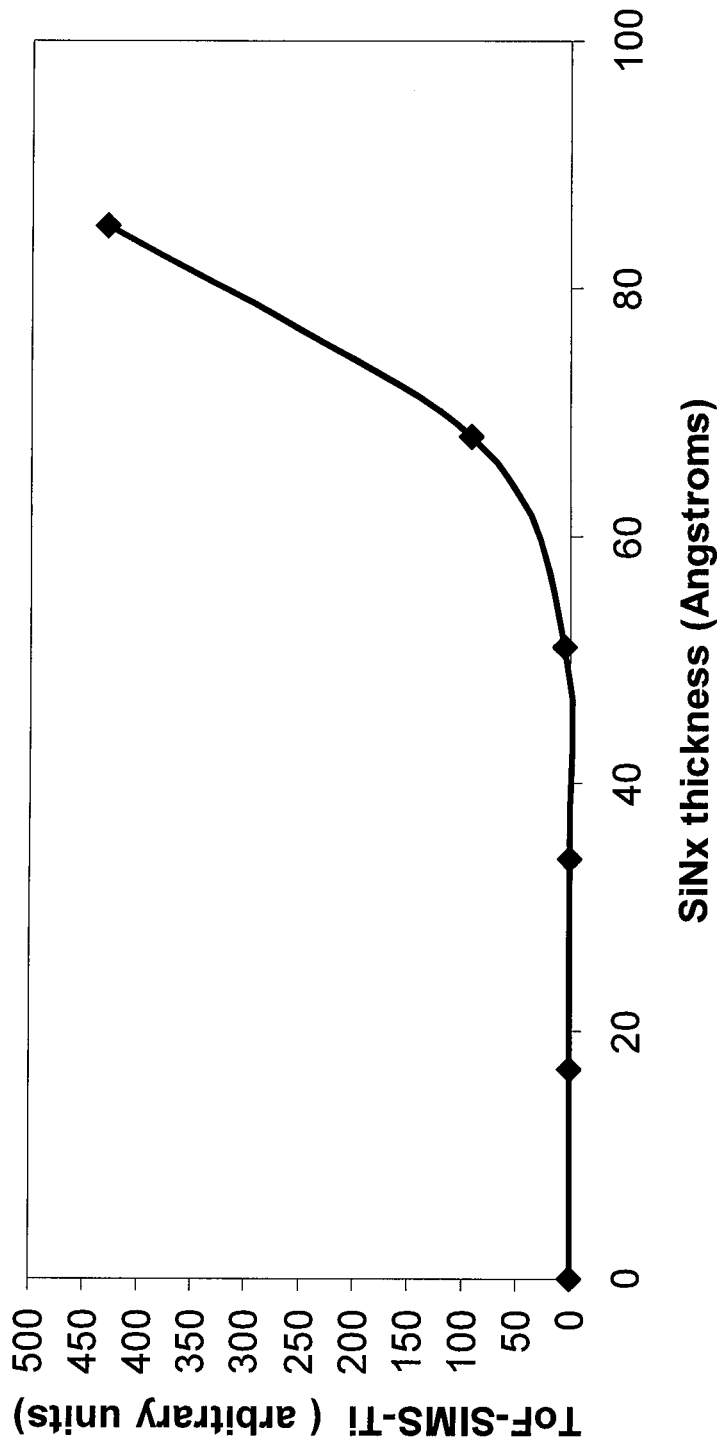
FIG. 5 is a chart depicting a representative concentration gradient of titanium sites within a silicon nitride layer of an example embodiment of the disclosure.

FIG. 5 is a chart depicting a representative concentration gradient of titanium sites within a silicon nitride layer as might be determined by ToF-SIMS and sectioning of the sample to various depths. In the example embodiment depicted in FIG. 5, a sample of silicon nitride having a depth of approximately 85 Angstroms was plasma treated using an ammonia plasma in the presence of a titanium source. As shown in FIG. 5, this example had implantation of titanium showing a distinct gradient of metal sites, with the concentration at a depth of approximately 35 Angstroms being approximately two orders of magnitude less than at the surface of the silicon nitride material. Although the ordinate units are arbitrary in FIG. 5, surface concentrations for one embodiment are in the range of $10^{18}$-$10^{20}$ particles/cm$^3$.

Charge-trapping nodes treated in accordance with embodiments of the disclosure have been shown to exhibit improvements in program and erase voltages in comparison with similar untreated charge-trapping dielectrics. Table 2 depicts program and erase voltages at flat band, indicating reduced magnitudes of the potentials required to accumulate charge on, or to discharge, treated charge-trapping nodes compared to a control.

TABLE 2

Program and Erase Voltages at Flat Band (Ammonia Plasma/Titanium Metal Source/Silicon Nitride)

| Process | Erase Vg-Vfb | Program Vg-Vfb |
|---|---|---|
| Control 0 W 0 s | −27.0 | 15.5 |
| 500 W 80 s | −21.0 | 17.0 |
| 500 W 160 s | −18.5 | 17.0 |
| 800 W 80 s | −18.0 | 17.5 |
| 800 W 160 s | −16.5 | 17.0 |

CONCLUSION

Dielectric materials having implanted metal sites have been described and are suitable for use as charge-trapping nodes of non-volatile memory cells. By incorporating metal sites into dielectric charge-trapping materials using an ammonia plasma and a metal source, improved programming and erase voltages may be facilitated.

Although specific embodiments have been illustrated and described herein, it will be appreciated by those of ordinary skill in the art that any arrangement that is calculated to achieve the same purpose may be substituted for the specific embodiments shown. Many adaptations of the disclosure will be apparent to those of ordinary skill in the art. Accordingly, this application is intended to cover any adaptations or variations of the disclosure.

What is claimed is:

1. A method of forming a memory cell, comprising:
   forming a gate dielectric over an active area of a semiconductor substrate;
   forming a dielectric charge-trapping material over the gate dielectric;
   generating a plasma from component gases comprising at least ammonia, nitrogen, argon, helium, or hydrogen;
   contacting the plasma concurrently with a solid metal source and a surface of the dielectric charge-trapping material, thereby implanting metal sites from the solid metal source into the surface of the dielectric charge-trapping material;
   forming an intergate dielectric over the dielectric charge-trapping material after implanting the metal sites into the surface of the dielectric charge-trapping material; and
   forming a control gate over the intergate dielectric.

2. The method of claim 1, wherein forming the dielectric charge-trapping material comprises forming a silicon nitride material.

3. The method of claim 1, wherein generating the plasma comprises generating the plasma using a power of approximately 200-1000 W.

4. The method of claim 3, wherein generating the plasma comprises generating the plasma using a power of approximately 400-800 W.

5. The method of claim 1, further comprising using a combination of a power for generating the plasma and an exposure time for contacting the plasma concurrently with the solid metal source and the surface of the dielectric charge-trapping material to generate a concentration of the metal sites having a magnitude of approximately $10^{18}$-$10^{20}$ particles/cm$^3$ near the surface of the dielectric charge-trapping material.

6. The method of claim 5, further comprising using the combination of the power for generating the plasma and the exposure time for contacting the plasma concurrently with the solid metal source and the surface of the dielectric charge-trapping material to generate a concentration of the metal sites having a magnitude of approximately $10^{17}$-$10^{19}$ particles/cm$^3$ approximately 2 nm from the surface of the dielectric charge-trapping material.

7. The method of claim 6, further comprising using the combination of the power for generating the plasma and the exposure time for contacting the plasma concurrently with the solid metal source and the surface of the dielectric charge-trapping material to generate a concentration gradient of the metal sites falling substantially two orders of magnitude within 4 nm from the surface of the dielectric charge-trapping material.

8. The method of claim 1, wherein implanting the metal sites into the surface of the dielectric charge-trapping material comprises implanting sufficient metal sites into the surface of the dielectric charge-trapping material until the metal sites constitute at least approximately 0.0001 at % of the dielectric charge-trapping material.

9. The method of claim 8, wherein implanting the metal sites into the surface of the dielectric charge-trapping material further comprises implanting sufficient metal sites into the surface of the dielectric charge-trapping material until the metal sites constitute less than about 0.5 at % of the dielectric charge-trapping material.

10. The method of claim 1, wherein implanting the metal sites into the surface of the dielectric charge-trapping material further comprises implanting sufficient metal sites into the surface of the dielectric charge-trapping material until the metal sites constitute between approximately 0.0001-0.5 at % of the dielectric charge-trapping material.

11. The method of claim 1, wherein implanting the metal sites into the surface of the dielectric charge-trapping material further comprises implanting the metal sites in any distribution as needed.

12. The method of claim 1, wherein generating the plasma and contacting the plasma with the solid metal source comprises generating the plasma in reactor system and contacting the plasma with a solid metal source comprising a component of the reactor system.

13. The method of claim 1, wherein generating the plasma and contacting the plasma with the solid metal source comprises generating the plasma in a reactor system and contacting the plasma with a solid metal source comprising an interior wall of the reactor system.

14. The method of claim 1, wherein contacting the plasma with the solid metal source comprises contacting the plasma with a solid metal source selected from the group consisting of refractory metals, noble metals and near noble metals.

15. The method of claim 1, wherein contacting the plasma with the solid metal source comprises contacting the plasma with solid titanium.

16. The method of claim 1, wherein generating the plasma from component gases comprising at least ammonia, nitrogen, argon, helium, or hydrogen comprises generating the plasma from the component gases and at least one ambient gas.

17. The method of claim 16, wherein generating the plasma from component gases comprises generating the plasma from component gases comprising approximately 30-50 volume % of the component gases.

18. A method of forming a memory cell, comprising:
    forming a gate dielectric over an active area of a semiconductor substrate;
    forming a charge-trapping node over the gate dielectric;
    generating a plasma from component gases comprising at least ammonia, nitrogen, helium, hydrogen, or argon;
    contacting the plasma concurrently with a solid titanium source and a surface of the charge-trapping node, thereby implanting titanium sites from the solid titanium source into the surface of the charge-trapping node;
    forming an intergate dielectric over the charge-trapping node after implanting the titanium sites into the surface of the charge-trapping node; and
    forming a control gate over the intergate dielectric.

19. The method of claim 18, further comprising using a combination of a power for generating the plasma and an exposure time for contacting the plasma concurrently with the solid titanium source and the surface of the charge-trapping node to generate a concentration of the titanium sites having a magnitude of approximately $10^{18}$-$10^{20}$ particles/cm$^3$ near the surface of the charge-trapping node, a concentration of the titanium sites having a magnitude of approximately $10^{17}$-$10^{19}$ particles/cm$^3$ approximately 2 nm from the surface of the charge-trapping node, and a concentration gradient of the titanium sites falling substantially two orders of magnitude within 4 nm from the surface of the charge-trapping node.

20. The method of claim 18, wherein implanting the titanium sites into the surface of the charge-trapping node further comprises implanting sufficient titanium sites into the surface of the charge-trapping node until the titanium sites constitute at least 0.1 at % of the charge-trapping node and less than 0.5 at % of the charge-trapping node.

21. The method of claim 18, wherein generating the plasma from component gases comprises generating the plasma from component gases comprising approximately 30-50 volume % of the component gases.

* * * * *